(12) United States Patent
Kanai et al.

(10) Patent No.: US 10,386,419 B2
(45) Date of Patent: Aug. 20, 2019

(54) BATTERY MANAGEMENT DEVICE, BATTERY MONITORING CIRCUIT, AND CONTROL SYSTEM

(71) Applicant: HITACHI AUTOMOTIVE SYSTEMS, LTD., Hitachinaka-shi, Ibaraki (JP)

(72) Inventors: Tomonori Kanai, Hitachinaka (JP); Akihiko Kudo, Hitachinaka (JP); Tomoyuki Arima, Hitachinaka (JP); Akiko Tsukamoto, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 85 days.

(21) Appl. No.: 15/555,750

(22) PCT Filed: Mar. 4, 2016

(86) PCT No.: PCT/JP2016/056698
§ 371 (c)(1),
(2) Date: Sep. 5, 2017

(87) PCT Pub. No.: WO2016/143679
PCT Pub. Date: Sep. 15, 2016

(65) Prior Publication Data
US 2018/0052207 A1    Feb. 22, 2018

(30) Foreign Application Priority Data

Mar. 11, 2015 (JP) .................................. 2015-048798

(51) Int. Cl.
*G01N 27/416*    (2006.01)
*G01R 31/388*    (2019.01)
(Continued)

(52) U.S. Cl.
CPC .......... *G01R 31/388* (2019.01); *G01R 31/02* (2013.01); *G01R 31/36* (2013.01); *G01R 31/364* (2019.01);
(Continued)

(58) Field of Classification Search
CPC ............. H01M 10/425; H01M 10/482; H01M 10/441; B60L 11/1803; B60L 2240/545;
(Continued)

(56) References Cited

U.S. PATENT DOCUMENTS 5,656,915 A * 8/1997 Eaves ................. H01M 10/482
320/118
6,803,766 B2 * 10/2004 Kobayashi ....... G01R 19/16542
324/434
(Continued)

FOREIGN PATENT DOCUMENTS

JP    2010-249793 A    11/2010
JP    2011-117852 A    6/2011
(Continued)

OTHER PUBLICATIONS

International Search Report, PCT/JP2016/056698, dated May 10, 2016, 2 pgs.
(Continued)

*Primary Examiner* — Thang X Le
(74) *Attorney, Agent, or Firm* — Volpe and Koenig, P.C.

(57) ABSTRACT

Measurement of a cell voltage is executed immediately after diagnosis of a battery management device is ended. In a battery management device, current sources repeatedly perform an energization operation to cause a current to flow to voltage detection lines with a magnitude of the current that enables each amount of charge stored in capacitors changed by one energization operation to fall within a range corresponding to a fluctuation width of terminal voltages of
(Continued)

battery cells during the energization operation when resistors are in a normal state. When the difference between the current terminal voltage of the battery cell and the past terminal voltage of the battery cell is larger than the predetermined threshold value, the microcomputer diagnoses that the resistor is in the open state.

7 Claims, 5 Drawing Sheets

(51) Int. Cl.
    *G01R 31/364*     (2019.01)
    *G01R 31/3828*     (2019.01)
    *G01R 31/3835*     (2019.01)
    *G01R 31/36*     (2019.01)
    *G01R 31/02*     (2006.01)

(52) U.S. Cl.
    CPC ..... *G01R 31/3828* (2019.01); *G01R 31/3835* (2019.01); *H01M 2220/20* (2013.01)

(58) Field of Classification Search
    CPC ......... B60L 2240/547; B60L 2240/549; Y02T 10/7055; Y02T 10/7044; Y02T 10/7005; Y02T 10/7061; Y02T 10/7066; Y02T 10/7072; Y02T 10/7077; Y02T 10/7241; Y02T 10/7291
See application file for complete search history.

(56) References Cited

U.S. PATENT DOCUMENTS

| | | | |
|---|---|---|---|
| 9,340,122 B2* | 5/2016 | Yamauchi | ........... B60L 11/1866 |
| 2004/0193988 A1 | 9/2004 | Saloio | |
| 2008/0164881 A1 | 7/2008 | Miyamoto | |
| 2010/0244847 A1 | 9/2010 | Kudo et al. | |
| 2012/0081128 A1 | 4/2012 | Laber et al. | |
| 2012/0179411 A1 | 7/2012 | Sugimura | |
| 2014/0043041 A1* | 2/2014 | Reimann | ............... G01R 31/041 324/538 |
| 2015/0035487 A1* | 2/2015 | Kawamoto | ........... H02J 7/0016 320/112 |
| 2016/0003914 A1 | 1/2016 | Allen et al. | |

FOREIGN PATENT DOCUMENTS

| | | |
|---|---|---|
| JP | 2012-145418 A | 8/2012 |
| JP | 2012-172992 A | 9/2012 |
| JP | 2014-219277 A | 11/2014 |
| WO | 2014/024635 A1 | 2/2014 |

OTHER PUBLICATIONS

Extended European Search Report dated Nov. 16, 2018 for the European Patent Application No. 16761649.9.

* cited by examiner

BATTERY MANAGEMENT DEVICE, BATTERY MONITORING CIRCUIT, AND CONTROL SYSTEM

TECHNICAL FIELD

The present invention relates to a battery management device, a battery monitoring circuit, and a control system.

BACKGROUND ART

In hybrid electric vehicles (HEV), electric vehicles (EV) and the like, assembled batteries (battery systems) configured by connecting a large number of battery cells of a secondary battery in series to each other are generally used in order to secure a desired high voltage. Conventionally, a battery management device using an integrated circuit or the like is connected for each predetermined number of battery cells in such an assembled battery in order for capacity calculation and protection management of each battery cell. The battery cells are managed by controlling each charge or discharge state of the battery cells using the battery management device.

In particular, in the case of an assembled battery in which a lithium ion battery is used as a battery cell, it is dangerous that the battery management device does not operate normally and is turned into an overcharged state since the lithium ion battery has a high energy density. In this regard, a technique in PTL 1 is known in order to enhance reliability and safety of the battery management device. PTL 1 discloses a technique in which pseudo voltage information is input to a battery state detection circuit that detects a battery state of a battery cell to diagnose whether or not the battery state detection circuit is operating normally.

CITATION LIST

Patent Literature

PTL 1: JP 2010-249793 A

SUMMARY OF INVENTION

Technical Problem

In general, an RC filter is connected to a voltage detection line, connected between a battery cell and a battery management device, as a noise filter for removal of noise. Thus, when pseudo voltage information is input to a battery management device to perform diagnosis of the battery management device as in the technique described in PTL 1, a standby time according to a time constant of the RC filter is required until an input voltage matches a cell voltage after input of the pseudo voltage information is ended. Accordingly, there is a problem that it is difficult to execute measurement of the cell voltage immediately after ending the diagnosis of the battery management device.

Solution to Problem

A battery management device according to the present invention includes: a voltage detection unit that is electrically connected to both poles of each of a plurality of battery cells via a voltage detection line and detects each terminal voltage of the plurality of battery cells; a filter circuit that is configured using a resistor and a capacitor and electrically connected to the voltage detection line; a current source that repeatedly performs an energization operation to cause a current to flow to the voltage detection line in order to change a stored charge amount of the capacitor; and a diagnosis unit that diagnoses whether the resistor is in a normal state or an open state based on a result of detection of the terminal voltage performed by the voltage detection unit. The current source performs the energization operation with a magnitude of a current that enables the stored charge amount changed by the energization operation performed once to fall within a range corresponding to a fluctuation width of the terminal voltage during the energization operation when the resistor is in the normal state. The diagnosis unit diagnoses that the resistor is in the open state when a difference between the terminal voltage detected at a current time and the terminal voltage detected at a past time is larger than a predetermined threshold value.

A battery monitoring circuit according to the present invention includes: a voltage detection unit that is electrically connected to both poles of each of a plurality of battery cells via a voltage detection line to which a filter circuit configured using a resistor and a capacitor is connected, and detects each terminal voltage of the plurality of battery cells; and a current source that repeatedly performs an energization operation to cause a current to flow to the voltage detection line in order to change a stored charge amount of the capacitor. The current source performs the energization operation with a magnitude of a current that enables the stored charge amount changed by the energization operation performed once to fall within a range corresponding to a fluctuation width of the terminal voltage during the energization operation when the resistor is in a normal state.

A control system according to one aspect of the present invention includes: the above-described battery management device; a traveling inverter that performs drive control of a traveling motor configured to cause a vehicle equipped with the battery management device to travel using power supplied from an assembled battery configured of the plurality of battery cells; and a vehicle control device that controls the traveling inverter. The battery management device outputs abnormality information on an abnormality to the vehicle control device when it is diagnosed that at least one of the plurality of battery cells is abnormal or diagnosed that the resistor is in an open state. The vehicle control device performs control to limit power supply from the assembled battery with respect to the traveling inverter based on the abnormality information. The vehicle control device mitigates the limit on the power supply from the assembled battery when the resistor is the open state as compared to a case where at least any one of the plurality of battery cells is abnormal during the control.

A control system according to another aspect of the present invention includes: the above-described battery management device; and a control device that performs control of a device using power to be supplied from an assembled battery configured of the plurality of battery cells. The control device outputs noise information on noise, output from the device to the assembled battery, to the battery management device. The battery management device invalidates diagnosis of the resistor performed by the diagnosis unit and/or detection of the terminal voltage performed by the voltage detection unit based on the noise information.

A control system according to further another aspect of the present invention includes: the above-described battery management device; and a control device that performs control of a device using power to be supplied from an assembled battery configured of the plurality of battery cells. The control device estimates noise to be output from the device to the assembled battery and invalidates a diagnosis result of the resistor and/or a detection result of the terminal voltage output from the battery management device based on an estimation result.

Advantageous Effects of Invention

According to the present invention, it is possible to execute measurement of a cell voltage immediately after ending diagnosis of a battery management device.

DESCRIPTION OF EMBODIMENTS

—First Embodiment—

Figure 1:
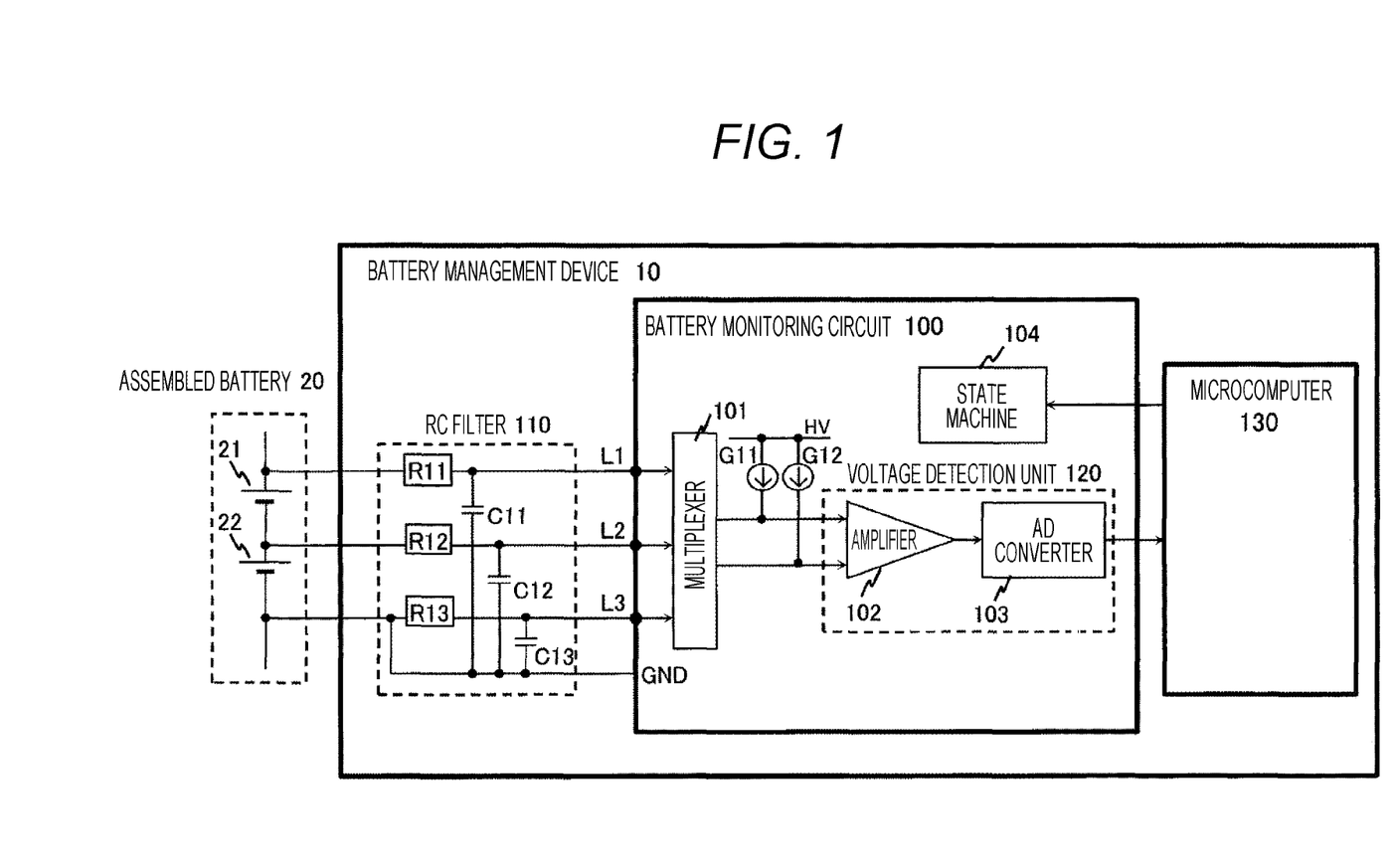
FIG. 1 is a diagram illustrating a configuration of a battery management device according to a first embodiment of the present invention.

FIG. 1 is a diagram illustrating a configuration of a battery management device 10 according to a first embodiment of the present invention. The battery management device 10 is configured to manage battery cells 21 and 22 of an assembled battery 20, and includes a battery monitoring circuit 100, an RC filter 110, and a microcomputer 130. Incidentally, FIG. 1 illustrates a configuration of the battery management device 10 that manages the assembled battery 20 assuming that the assembled battery 20 is configured of the two battery cells 21 and 22. However, the number of battery cells forming the assembled battery 20 is not limited thereto. It is possible to configure the assembled battery 20 using an arbitrary number of battery cells and determine the configuration of the battery management device 10 in accordance with the number of the battery cells.

The battery monitoring circuit 100 includes a multiplexer 101, a voltage detection unit 120, a state machine 104, and current sources G11 and G12. The voltage detection unit 120 is electrically connected to both poles of each of the battery cells 21 and 22 via the multiplexer 101 and voltage detection lines L1, L2 and L3. The voltage detection unit 120 includes an amplifier 102 and an AD converter 103.

The multiplexer 101 selects any of the battery cells 21 and 22 as a measurement target of a terminal voltage in response to an instruction pf the microcomputer 130. Further, a pair of voltage detection lines connected to both poles of a battery cell as the measurement target are selected among the voltage detection lines L1, L2 and L3, and each voltage is output to the voltage detection unit 120. The amplifier 102 generates a voltage signal obtained by level-shifting a potential difference between the pair of voltage detection lines selected by the multiplexer 101, and outputs the voltage signal to the AD converter 103. The AD converter 103 detects a terminal voltage (cell voltage) of the battery cell as the measurement target by detecting the voltage signal output from the amplifier 102. The battery monitoring circuit 100 can detect the terminal voltage of each of the battery cells 21 and 22 by sequentially performing the above-described operation for the battery cells 21 and 22. A detection result of the terminal voltage obtained by the AD converter 103 is converted from an analog value to a digital value and is read by the microcomputer 130.

The microcomputer 130 monitors and manages the assembled battery 20 based on the detection result of the terminal voltage read from the AD converter 103. For example, when the terminal voltage indicates an abnormal value, it is determined that there is an abnormality in the assembled battery 20, and a signal indicating such a determination result is output to a host controller (not illustrated).

The state machine 104 is a logic circuit that performs a logic operation configured to switch the multiplexer 101 according to an instruction of the microcomputer 130. The multiplexer 101 sequentially selects the voltage detection lines L1, L2 and L3 according to the result of the logic operation performed by the state machine 104.

The RC filter 110 is configured to remove noise superimposed on the voltage detection lines L1, L2 and L3, and is electrically connected to the voltage detection lines L1, L2 and L3. The RC filter 110 is configured of resistors R11, R12 and R13, respectively, provided on the voltage detection lines L1, L2 and L3 and capacitors C11, C12 and C13, respectively, provided between the voltage detection lines L1, L2 and L3 and a ground line GND.

The current sources G11 and G12 perform an energization operation to cause a current applied from a highest potential HV of the assembled battery 20 to flow to the voltage detection lines L1, L2, and L3. This energization operation is performed in accordance with the selection operation of the voltage detection lines L1, L2 and L3 performed by the multiplexer 101. For example, when the multiplexer 101 selects the voltage detection lines L1 and L2 to be connected to the voltage detection unit 120, the current sources G11 and G12 are electrically connected to the voltage detection lines L1 and L2, respectively, via the multiplexer 101. At this time, when the current sources G11 and G12 are in an on state, currents flow from the current sources G11 and G12 to the voltage detection lines L1 and L2, respectively, in a direction from the right side to the left side in the drawing. As a result of such an energization operation, each amount of charge stored in the capacitors C11 and C12 of the RC filter 110 changes in an increasing direction.

Thereafter, when the multiplexer 101 selects another voltage detection line or the current sources G11 and G12 are turned off, the energization operation for the voltage detection lines L1 and L2 is ended and the change in the amount of charge stored in the capacitors C11 and C12 is stopped. Then, currents in a direction opposite to that during the energization flow through the resistors R11 and R12 to the voltage detection lines L1 and L2, respectively. Accordingly, each amount of charge stored in the capacitors C11 and C12 changes in a decreasing direction depending on a time constant of the RC filter 110. As a result, the change in the stored charge amount during the energization is gradually eliminated and returns to an original stored charge amount. Incidentally, each on or off state of the current sources G11 and G12 can be individually controlled by the microcomputer 130.

As the switching of the above-described energization operation is sequentially performed for the voltage detection lines L1, L2 and L3, the current intermittently flows from the current sources G11 and G12 to the voltage detection lines L1, L2, and L3 in accordance with the selection operation of the multiplexer 101. Accordingly, each amount of charge stored in the capacitors C11, C12, and C13 repeatedly increases and decreases in the same direction depending on the time constant of the RC filter 110.

Incidentally, the current is intermittently applied from the current sources G11 and G12 as described above in the energization operation of the voltage detection lines L1, L2 and L3. Thus, it is possible to set each output current of the current sources G11 and G12 to be higher even when an average current is the same than that in the case of constantly applying a current. Thus, it is possible to suppress variations in the output currents of the current sources G11 and G12.

In addition, the selection operation of the multiplexer 101 is performed based on a result of the logic operation of the state machine 104 in the battery monitoring circuit 100. At this time, the state machine 104 can execute the logic operation with only one instruction output from the microcomputer 130, and cause the multiplexer 101 to perform the selection operation. Accordingly, it is possible to shorten time for which the current flows to the voltage detection lines L1, L2 and L3 as compared to a case where the energization operation is switched by the instruction from the microcomputer 130 without using the state machine 104. Thus, it is possible to set the output currents of the current sources G11 and G12 to be further higher and to suppress the variations thereof.

The microcomputer 130 acquires detection results of the terminal voltages of the battery cells 21 and 22 at the time of repeatedly performing the switching of energization states of the voltage detection lines L1, L2, and L3 in the above-described manner.

Further, the microcomputer 130 diagnoses whether the resistors R11, R12 and R13 of the RC filter 110 are in a normal state or an abnormal open state based on the acquired detection results of the terminal voltages. Accordingly, diagnosis on whether or not the battery management device 10 is normal is performed.

For example, it is considered a case where energization of the voltage detection lines L1 and L2 is ended after energizing the voltage detection lines L1 and L2, respectively, from the current sources G11 and G12 and changing the amount of charge stored in the capacitors C11 and C12. In this case, if both the resistors R11 and R12 are in the normal state, the change in the amount of charge stored in the capacitors C11 and C12 during energization is gradually eliminated depending on the time constant of the RC filter 110. Thus, the voltages of the voltage detection lines L1 and L2 return to the respective original voltages before being energized after sufficient time has elapsed from the end of energization. In the meantime, a measurement value of the terminal voltage of the battery cell 21 does not change. However, the change in the amount of charge stored in the capacitor C11 during energization is not eliminated even after the energization of the voltage detection line L1 is ended, for example, if the resistor R11 is in an open state due to failure or the like, and the stored charge amount increased during the energization is maintained. Thus, the amount of charge stored in the capacitor C11 gradually increases whenever energization of the voltage detection line L1 is repeated, and accordingly, the voltage of the voltage detection line L1 increases. On the other hand, as for the voltage detection line L2, the voltage returns to the original voltage after the end of energization, as described above, since the resistor R12 is in the normal state. As a result, the measurement value of the terminal voltage of the battery cell 21 increases by an amount corresponding to the increase in the voltage of the voltage detection line L1. The microcomputer 130 can diagnose whether the resistor R11 is in the normal state or in the open state using the above-described feature.

Further, the microcomputer 130 can perform diagnosis in the same manner with respect to the resistors R12 and R13 connected to the voltage detection lines L2 and L3, respectively. That is, it is possible to diagnose whether the resistors R12 and R13 are in the normal state or the open state by measuring the terminal voltages of the battery cells 21 and 22 when the energization of the voltage detection lines L2 and L3 is repeated using the current sources G11 and G12 and checking whether or not measurement values thereof change from original values. In this manner, the microcomputer 130 can diagnose whether the resistors R11, R12 and R13 of the RC filter 110 are in the normal state or the open state, respectively.

By performing the above-described diagnosis, the microcomputer 130 functions as a diagnosis unit that diagnoses a conduction state of the RC filter 110. As a result, when it is determined that the conduction state of the RC filter 110 is abnormal, the microcomputer 130 outputs a signal indicating such a determination result to a host controller (not illustrated).

As described above, the battery management device 10 performs the diagnosis on the conduction state of the RC filter 110 utilizing the change in the stored charge amount of the capacitors C11, C12, and C13 when the energization states of the voltage detection lines L1, L2 and L3 are switched. At this time, the battery management device 10 can quickly perform measurement of the terminal voltages of the battery cells 21 and 22 after the end of energization by limiting the currents flowing from the current sources G11 and G12 to the voltage detection lines L1, L2 and L3. This point will be described in detail hereinafter.

Incidentally, a battery monitoring device in which currents from the current sources G11 and G12 are not limited although having the same configuration as that of the battery management device 10 in FIG. 1 is used as a comparative example with respect to the present invention in the following description. That is, in the battery monitoring device according to the comparative example, the currents output from the current sources G11 and G12 are set to be larger than those of the battery management device 10 of FIG. 1 in order to enable diagnosis on whether the resistors R11, R12 and R13 of the RC filter 110 are in the normal state or the open state with the one energization operation.

Figure 2:
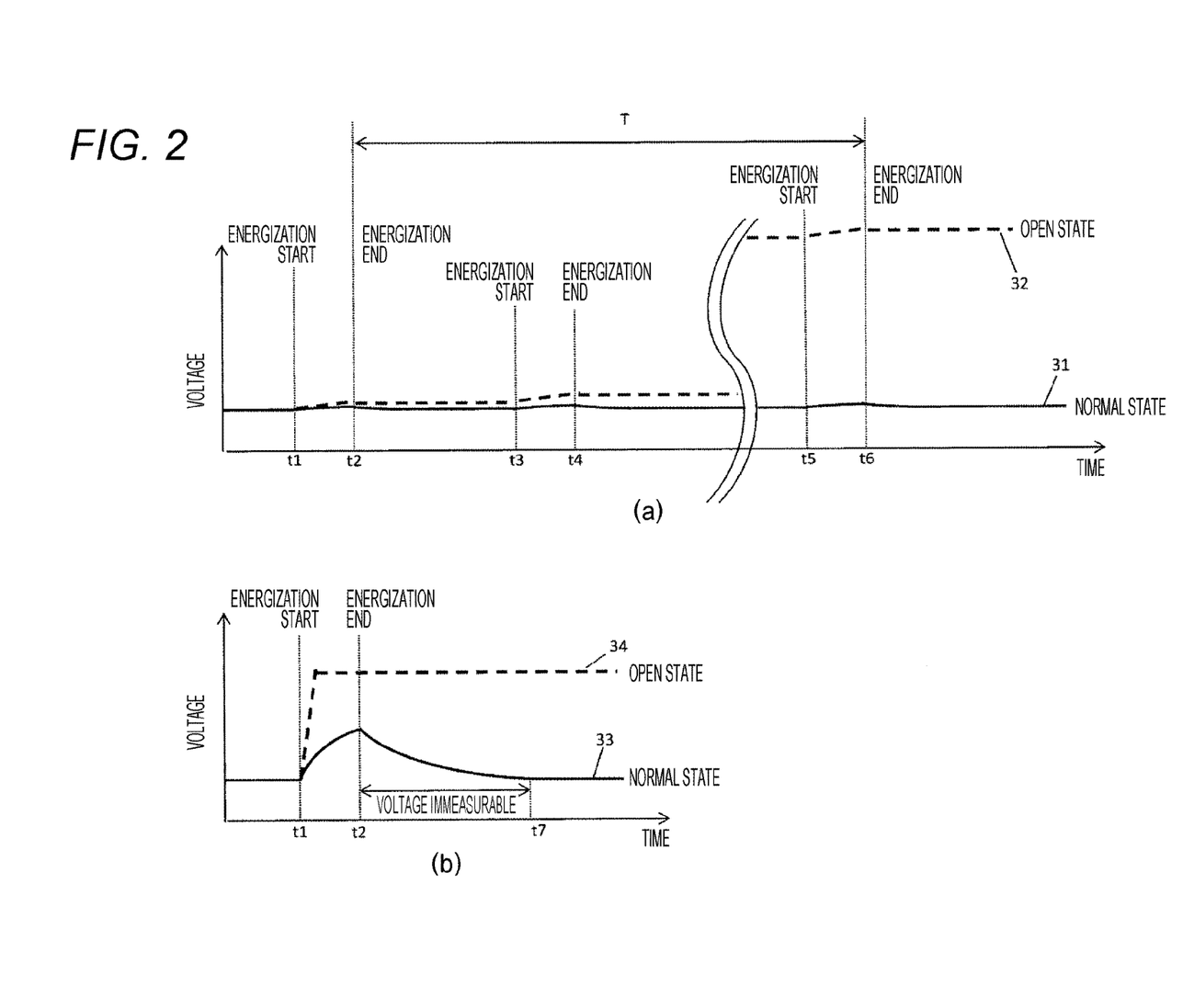
FIG. 2 is a diagram illustrating a voltage fluctuation state of a voltage detection line in the first embodiment of the present invention and a comparative example.

FIG. 2 is a diagram illustrating each voltage fluctuation state of each voltage detection line in the first embodiment of the present invention and the comparative example. FIG. 2(a) illustrates the voltage of the voltage detection line in the battery management device 10 according to the first embodiment of the present invention illustrated in FIG. 1, and FIG. 2(b) illustrates a voltage of the voltage detection line in the battery management device according to the comparative example. Incidentally, each of FIGS. 2(a) and 2(b) illustrates the voltage change state when a current is caused flow to the voltage detection line L1. However, voltages also change in the same manner as illustrated in FIGS. 2(a) and 2(b) even when the current is caused to flow to each of the voltage detection lines L2 and L3.

In the battery management device 10, the voltage of the voltage detection line L1 increases as the amount of charge stored in the capacitor C11 increases when energization of the voltage detection line L1 is started using the current source G11 at time t1. At this time, when the resistor R11 is in the normal state, the voltage of the voltage detection line L1 increases such as a line 31 indicated by the solid line in FIG. 2(a). A voltage change rate at this time is determined depending on a magnitude of the current of the current source G11 and the time constant of the RC filter 110. Thereafter, when the energization of the voltage detection line L1 is ended at time t2, the amount of charge stored in the capacitor C11 decreases, whereby the voltage of the voltage detection line L1 decreases and returns to the original value.

On the other hand, when the resistor R11 is in the open state, the voltage of the voltage detection line L1 increases such as a line 32 indicated by the broken line in FIG. 2(a). A voltage change rate at this time is determined depending on the magnitude of the current of the current source G11 and a capacitance value of the capacitor C11. Thereafter, the amount of charge stored in the capacitor C11 does not change even if the energization of the voltage detection line L1 is ended at the time t2, and thus, the voltage of the voltage detection line L1 does not decrease but is maintained without any change.

In the battery management device 10, the current flowing from the current source G11 to the voltage detection line L1 is limited as described above. Specifically, the magnitude of the current output from the current source G11 is set such that the amount of charge stored in C11, which changes with the one energization operation with respect to the voltage detection line L1, falls within a range that corresponds to a fluctuation width of the terminal voltage of the battery cell 21 during the energization operation when the resistor R11 is in the normal state. Incidentally, the fluctuation width of the terminal voltage of the battery cell 21 during the energization operation corresponds to a maximum fluctuation range when the measurement value of the terminal voltage of the battery cell 21 fluctuates within one energization operation period, that is, a period from the time t1 to the time t2. This is determined depending on a measurement error of the voltage detection unit 120 and a charge or discharge amount of the battery cell 21 during the energization operation.

In the battery management device 10, the current flowing from the current source G11 to the voltage detection line L1 at the time of energization is limited as described above. Accordingly, the voltage change of the voltage detection line L1 in one energization operation is too small to have no influence on measurement of the terminal voltage of the battery cell 21, as illustrated in FIG. 2(a). Thus, it is possible to immediately perform the measurement of the terminal voltage of the battery cell 21 after ending the energization at the time t2.

Incidentally, the case where the current is caused to flow from the current source G11 to the voltage detection line L1 has been described in the above description, but the same description is applied even for a case where a current is caused to flow from the current source G11 or G12 to the other voltage detection line L2 or L3. That is, a magnitude of each current output from the current sources G11 and G12 is set in the battery management device 10 such that the amount of charge stored in each of C11, C12, and C13 each of which is changed by one energization operation with respect to each of the voltage detection lines L1, L2 and L3 falls within a range corresponding to a fluctuation width of each terminal voltage of the battery cells 21 and 22 during the energization operation when the resistors R11, R12 and R13 are in the normal state, Thereby, it is configured such that the terminal voltages of the battery cells 21 and 22 can be measured immediately after the energization to the voltage detection lines L1, L2 and L3 is ended.

When energization of the voltage detection line L1 is started using the current source Gil at time t3, the voltage of the voltage detection line L1 increases again. At this time, when the resistor R11 is in the normal state, the voltage of the voltage detection line L1 changes in the same manner as the previous energization since the voltage of the voltage detection line L1 has returned to the magnitude before being energized as described above. Thereafter, when the energization of the voltage detection line L1 is ended at time t4, the voltage of the voltage detection line L1 decreases and returns to the original value. On the other hand, when the resistor R11 is in the open state, the voltage of the voltage detection line L1 further increases from the increase amount at the previous energization, and is maintained without any change even when the energization of the voltage detection line L1 is ended at the time t4. The same energization operation is repeatedly performed, and finally, the energization to the voltage detection line L1 is ended after the energization is performed in a period from time t5 to time t6.

When the energization operation is repeated a plurality of times as described above, the voltage of the voltage detection line L1 hardly changes as indicated by the line 31 in the case where the resistor R11 is in the normal state. On the other hand, in the case where the resistor R11 is in the open state, the voltage of the voltage detection line L1 gradually increases as indicated by the line 32, and accordingly, the terminal voltage of the battery cell 21 detected by the voltage detection unit 120 also increases. Accordingly, it is possible to diagnose that the resistor R11 is in the open state by setting a period from the time t2 to the time t6 as a diagnosis time T, and detecting that the increase in the terminal voltage of the battery cell 21 during the diagnosis time T is a predetermined threshold value or more using the microcomputer 130.

Incidentally, the above-described threshold value is preferably set to a value that reliably enables detection of the open state when the resistor R11, R12 or R13 is in the open state even in consideration of a change of the terminal voltage caused by a variation in each charge or discharge amount of the battery cells 21 and 22, inflow noise from the outside, or the like. Further, the diagnosis time T is preferably set based on a time required until the voltage change of the voltage detection lines L1, L2 or L3, caused depending on a sum of the stored charge amount of the capacitor C11, C12 or C13 changed by the plurality times of energization operations performed within the time, exceeds the threshold value when the resistor R11, R12 or R13 is in the open state.

In the battery management device according to the comparative example, when energization of the voltage detection line L1 is started by the current source G11 at the time t1, the amount of charge stored in the capacitor C11 increases, whereby the voltage of the voltage detection line L1 increases. At this time, when the resistor R11 is in the normal state, the voltage of the voltage detection line L1 increases as illustrated by the solid line 33 in FIG. 2(b). A voltage change rate at this time is determined depending on a magnitude of the current of the current source G11 and the time constant of the RC filter 110. Thereafter, when the energization of the voltage detection line L1 is ended at time t2, the amount of charge stored in the capacitor C11 decreases, whereby the voltage of the voltage detection line L1 decreases and returns to the original value.

On the other hand, when the resistor R11 is in the open state, the voltage of the voltage detection line L1 increases as illustrated by the dashed line 34 in FIG. 2(b). A voltage change rate at this time is determined depending on the magnitude of the current of the current source G11 and a capacitance value of the capacitor C11. Thereafter, the amount of charge stored in the capacitor C11 does not change even if the energization of the voltage detection line L1 is ended at the time t2, and thus, the voltage of the voltage detection line L1 does not decrease but is maintained without any change.

In the battery management device according to the comparative example, the current flowing from the current source G11 to the voltage detection line L1 is set such that it is possible to diagnose whether the resistor R11 is in the normal state or the open state with one energization operation. Thus, the voltage of the voltage detection line L1 greatly changes during one energization operation as illustrated in FIG. 2(b). Accordingly, when the resistor R11 is in the open state, the voltage of the voltage detection line L1 increases immediately after the start of energization as indicated by a line 34 and is maintained even after the end of energization. Accordingly, it is possible to immediately diagnose that the resistor R11 is in the open state based on the change in the terminal voltage of the battery cell 21. On the other hand, when the resistor R11 is in the normal state, it takes time until the voltage of the voltage detection line L1 decreases after the end of energization as indicated by a line 33. Accordingly, it is understood that it is difficult to measure the terminal voltage of the battery cell 21 during a period from the time t2 at which the energization is ended to time t7 at which the voltage of the voltage detection line L1 returns to the original value.

Figure 3:
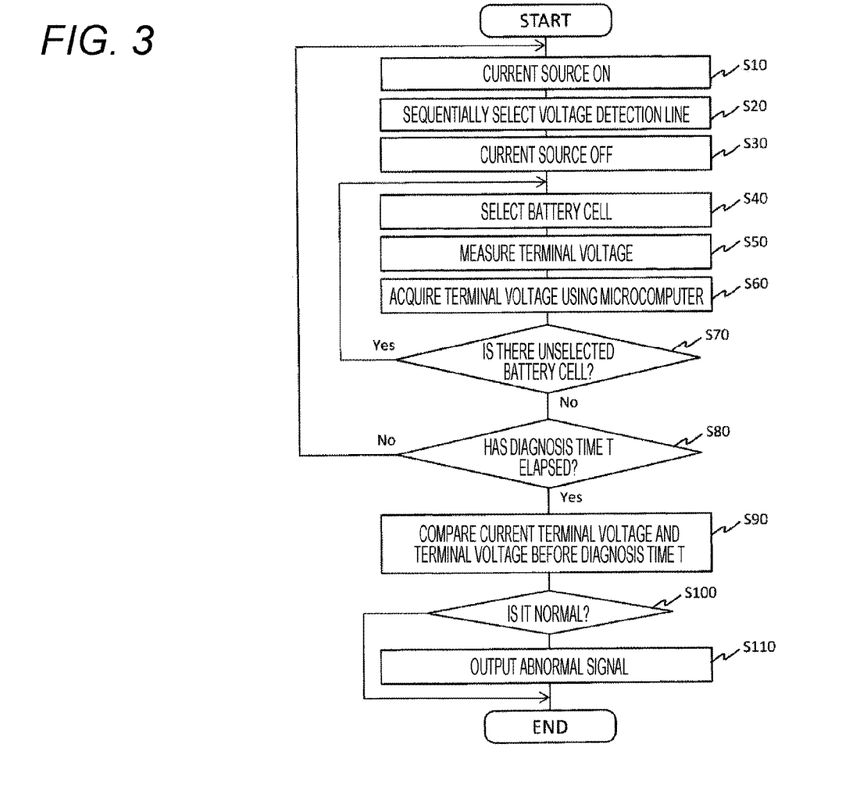
FIG. 3 is a flowchart of a diagnosis process executed in a battery management device according to an embodiment of the present invention.

Next, a process at the time of diagnosing the conduction state of the RC filter 110 in the battery management device 10 will be described. FIG. 3 is a flowchart of the diagnosis process executed in the battery management device 10 according to an embodiment of the present invention.

In Step S10, the battery management device 10 turns on the current sources G11 and G12. In Step S20, the battery management device 10 causes the multiplexer 101 to sequentially select the voltage detection lines L1, L2 and L3 using the state machine 104 of the battery monitoring circuit 100. Thus, energization to the voltage detection lines L1, L2 and L3 from the current sources G11 and G12 is sequentially performed, and accordingly, each amount of charge stored in the capacitors C11, C12 and C13 of the RC filter 110 changes. In Step S30, the battery management device 10 turns off the current sources G11 and G12.

Incidentally, the multiplexer 101 preferably sets the number of times that each of the voltage detection lines L1, L2 and L3 is connected to the voltage detection unit 120 to be the same when sequentially selecting the voltage detection lines L1, L2 and L3 in Step S20. That is, if the number of times of connection of any one of the voltage detection lines is small, a change in the amount of charge stored in a capacitor connected to the corresponding voltage detection line becomes smaller than that of the other capacitors. In order to avoid such a situation, it is preferable to switch the multiplexer 101 such that all number of times of selection of the voltage detection lines L1, L2 and L3 are the same in Step S20.

In Step S40, the battery management device 10 selects any one of the battery cells 21 and 22 as the measurement target of the terminal voltage using the state machine 104 and the multiplexer 101. In Step S50, the battery management device 10 measures the terminal voltage of the battery cell selected in Step S40 using the amplifier 102 and the AD converter 103 of the voltage detection unit 120. In Step S60, the battery management device 10 acquires the terminal voltage measured in Step S50 using the microcomputer 130.

In Step S70, the battery management device 10 determines whether or not there is a battery cell that is not selected in Step S40. If there is a battery cell unselected as the measurement target of the terminal voltage, the process returns to Step S40 and any battery cell among the unselected battery cells is selected in Step S40, and then, the above-described processes in Step S40 and the subsequent steps are repeated. Accordingly, the terminal voltages of the battery cells 21 and 22 are measured, and the measurement results thereof are acquired by the microcomputer 130. When it is determined that there is no unselected battery cell in Step S70, that is, when all the terminal voltages of the battery cells 21 and 22 have been acquired by the microcomputer 130, the process proceeds to Step S80.

In Step S80, the battery management device 10 determines whether or not the above-described diagnosis time T has elapsed from end of the first energization. When the elapsed time after the voltage detection lines are sequentially selected in Step S20 is shorter than the diagnosis time T, the process returns to Step S10 and the above-described processes in Step S10 and the subsequent steps are repeated. Accordingly, the energization operation is repeatedly performed until the diagnosis time T elapses, and the terminal voltages of the battery cells 21 and 22 are acquired by the microcomputer 130. When it is determined that the above-described diagnosis time T has elapsed from the end of the first energization, that is, when the elapsed time after the voltage detection lines are sequentially selected first in Step S20 is the diagnosis time T or longer, the process proceeds to Step S90.

In Step S90, the battery management device 10 compares the current terminal voltages of the battery cells 21 and 22 and the terminal voltages of the battery cells 21 and 22 acquired the diagnosis time T ago using the microcomputer 130. Here, the microcomputer 130 calculates a difference between a measurement value of the current, that is, the latest terminal value and a measurement value of the terminal voltage of each of the battery cells 21 and 22 acquired lastly within a time the diagnosis time T or more before the current time, for each of the battery cells 21 and 22.

In Step S100, the battery management device 10 determines whether the resistors R11, R12, and R13 are in the normal state or the open state based on a result of the comparison in Step S90 using the microcomputer 130. Here, it is determined whether or not the difference between the current terminal voltage calculated in Step S90 and the terminal voltage acquired the diagnosis time T ago is the above-described threshold value or larger. As a result, when the difference between the terminal voltages of both the battery cells 21 and 22 is smaller than the threshold value, it is determined that the resistors R11, R12 and R13 are normal. In this case, the battery management device 10 ends the diagnosis process illustrated in the flowchart of FIG. 3. On the other hand, when the difference between the terminal voltages of at least one of the battery cells 21 and 22 is the threshold value or the larger, it is determined that the resistor R11, R12 or R13 is in the open state. In this case, the battery management device 10 causes the process to proceed to Step S110. Incidentally, an abnormality detection counter may be provided such that the process proceeds to Step S110 only when it is determined that the abnormality (open state) is detected a plurality of times in Step S100 in order to prevent erroneous detection due to noise or the like. The abnormality detection counter in this case is cleared when a normal value is detected at least one time. Incidentally, a normality detection counter maybe provided such that the abnormality detection counter is cleared only when the normal value is detected a plurality of times.

When it is determined that the resistor R11, R12 or R13 is in the open state in Step S100, the battery management device 10 outputs a predetermined abnormality signal using the microcomputer 130 in Step S110. Here, the abnormality signal indicating that the conduction state of the RC filter 110 is abnormal is output from the microcomputer 130 to the host controller (not illustrated). After executing Step S110, the battery management device 10 ends the diagnosis process illustrated in the flowchart of FIG. 3.

According to the first embodiment of the present invention described above, the following operational effects are achieved.

(1) The battery management device 10 is provided with the battery monitoring circuit 100 including the multiplexer 101 and the voltage detection unit 120, the RC filter 110 and the microcomputer 130. The voltage detection unit 120 is electrically connected to both poles of the respective battery cells 21 and 22 via the voltage detection lines L1, L2 and L3, and detects the respective terminal voltages of the battery cells 21 and 22. The RC filter 110 is configured using the resistors R11, R12 and R13 and the capacitors C11, C12 and C13 and is electrically connected to the voltage detection lines L1, L2 and L3. The current sources G11 and G12 repeatedly perform the energization operation to cause the current to flow to the voltage detection lines L1, L2 and L3 in order to change the amount of charge stored in the capacitors C11, C12 and C13. The microcomputer 130 diagnoses whether the resistors R11, R12 and R13 are in the normal state or the open state based on the detection result of the terminal voltages of the battery cells 21 and 22 performed by the voltage detection unit 120. In the battery management device 10, the current sources G11 and G12 perform the energization operation with the magnitude of the current that enables the amount of charge stored in the capacitors C11, C12, and C13 changed by one energization operation to fall within the range corresponding to the fluctuation width of the terminal voltages of the battery cells 21 and 22 during the energization operation when the resistors R11, R12, and R13 are in the normal state. When the difference between the current terminal voltage of the battery cell 21 or 22 and the past terminal voltage of the battery cell 21 or 22 is larger than the predetermined threshold value, the microcomputer 130 diagnoses that the resistor R11, R12 or R13 is in the open state. In this manner, it is possible to immediately execute the measurement of the cell voltage after the end of diagnosis on the battery management device 10.

(2) When the difference between the current terminal voltage of the battery cell 21 or 22 and the terminal voltage of the battery cell 21 or 22 acquired the predetermined diagnosis time T before the current time is larger than the threshold value, the microcomputer 130 diagnoses that the resistor R11, R12 or R13 is in the open state. The diagnosis time T is set based on the time required until the voltage change of the voltage detection lines L1, L2 or L3, caused depending on the sum of the stored charge amount of the capacitors C11, C12 and C13 each of which is changed by the plurality times of energization operations performed within the time, exceeds the threshold value when the resistor R11, R12 or R13 is in the open state. In this manner, when the resistor R11, R12 or R13 is in the open state, it is possible to reliably diagnose such an open state.

(3) The current sources G11 and G12 perform the energization operation such that each amount of charge stored in the capacitors C11, C12, and C13 changes in the same direction. In this manner, when the resistors R11, R12 and R13 are in the normal state, it is possible to align the voltage changes of the voltage detection lines L1, L2 and L3 at the time of energization and at the time of ending the energization in the same direction. Thus, it is possible to diagnose whether the resistors R11, R12 and R13 are in the normal state or the open state without affecting the measurement results of the terminal voltages of the battery cells 21 and 22.

(4) The battery management device 10 further includes the multiplexer 101 that sequentially selects the voltage detection lines L1, L2 and L3 to be connected to the voltage detection unit 120. The current sources G11 and G12 are connected to the voltage detection lines L1, L2 and L3 via the multiplexer 101. At the time of performing energization to the voltage detection lines L1, L2 and L3, the currents intermittently flow from the current sources G11 and G12 to the voltage detection lines L1, L2 and L3 according to the selection operation of the multiplexer 101. In this manner, it is possible to set the output currents of the current sources G11 and G12 to be large and to suppress the variations thereof.

(5) It is preferable that the multiplexer 101 sequentially select the voltage detection lines L1, L2 and L3 such that each of the voltage detection lines L1, L2 and L3 is connected to the voltage detection unit 120 the same number of times. In this manner, it is possible to equalize the changes in the amount of charge stored in the capacitors C11, C12 and C13 connected to the voltage detection lines L1, L2 and L3, respectively. Thus, it is possible to accurately diagnose whether the resistors R11, R12 and R13 are in the normal state or the open state without affecting the measurement results of the terminal voltages of the battery cells 21 and 22.

—Second Embodiment—

Next, a second embodiment of the present invention will be described. In the present embodiment, a control system using the battery management device described in the first embodiment will be described.

Figure 4:
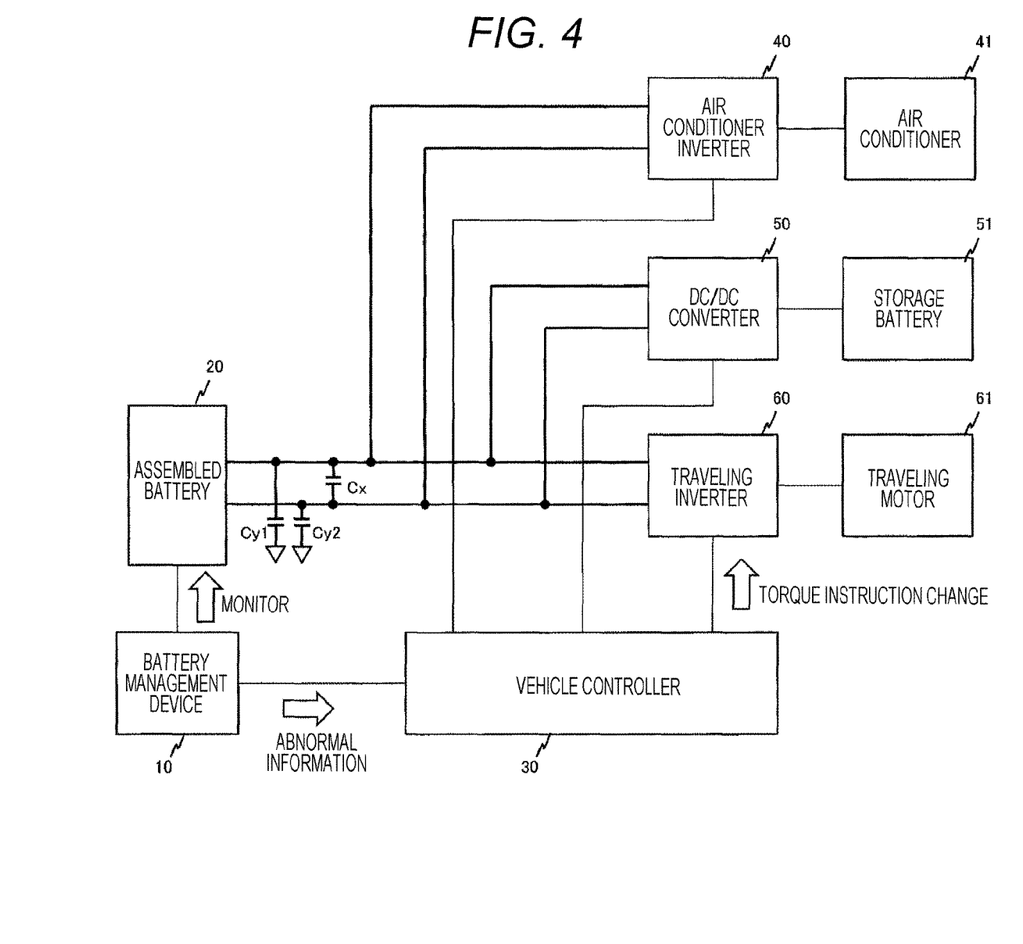
FIG. 4 is a diagram illustrating a configuration of a control system according to a second embodiment of the present invention.

FIG. 4 is a diagram illustrating a configuration of the control system according to the second embodiment of the present invention. The control system illustrated in FIG. 4 is mounted in a vehicle, and includes the battery management device 10, the assembled battery 20, a vehicle controller 30, an air conditioner inverter 40, a DC/DC converter 50, and a traveling inverter 60. The battery management device 10 and the assembled battery 20 are the same as those described in the first embodiment.

The vehicle controller 30 is connected to the air conditioner inverter 40, the DC/DC converter 50, and the traveling inverter 60, and controls various in-vehicle devices including these devices. The vehicle controller 30 is also connected to the battery management device 10 and functions as a host controller of the battery management device 10.

The air conditioner inverter 40 converts DC power supplied from the assembled battery 20 to AC power and outputs the converted AC power to an air conditioner 41 under control of the vehicle controller 30. The air conditioner 41 performs air conditioning control in the vehicle by operating a compressor (not illustrated) using the AC power output from the air conditioner inverter 40.

The DC/DC converter 50 converts a voltage of the DC power supplied from the assembled battery 20 to a desired voltage and outputs the converted voltage to a storage battery 51 under the control of the vehicle controller 30. The storage battery 51 stores the DC power output from the DC/DC converter 50 and supplies the stored power to various electrical components of the vehicle as necessary. Conversely, the output power from the storage battery 51 may be voltage-converted by the DC/DC converter 50 and output to the assembled battery 20.

The traveling inverter 60 converts the DC power supplied from the assembled battery 20 to AC power and outputs the converted AC power to the traveling motor 61, thereby performing driving control of the traveling motor 61 under the control of the vehicle controller 30. The traveling motor 61 supplies a driving force to driving wheels of the vehicle and causes the vehicle to travel when being driven using the AC power output from the traveling inverter 60.

Incidentally, an X capacitor Cx and Y capacitors Cy1 and Cy2 are provided between the assembled battery 20 and the air conditioner inverter 40, the DC/DC converter 50, and the traveling inverter 60. The X capacitor Cx is configured mainly to remove normal mode noise, and the Y capacitors Cy1 and Cy2 are configured mainly to remove common mode noise.

In the control system of the present embodiment, the battery management device 10 monitors and manages the assembled battery 20 as described in the first embodiment. At this time, the battery management device 10 measures the respective terminal voltages of the battery cells 21 and 22 forming the assembled battery 20, and diagnoses whether the respective resistors R11, R12 and R13 of the RC filter 110 are in the normal state or the open state while diagnosing whether or not the battery cells 21 and 22 are abnormal based on the measurement results. As a result, when it is diagnosed that at least one of the battery cells 21 and 22 is abnormal, or it is diagnosed that at least one of the resistors R11, R12 and R13 is in the open state, a signal indicating such a diagnosis result is output to the vehicle controller 30 as abnormality information on the abnormality.

When receiving the abnormality information output from the battery management device 10 as described above, the vehicle controller 30 changes a torque instruction to be output to the traveling inverter 60 based on the abnormality information. Accordingly, control to limit the power supply from the assembled battery 20 is performed with respect to the traveling inverter 60. At this time, the torque instruction to be output is switched as follows in accordance with content of the abnormality indicated by the abnormality information.

When it is diagnosed that at least one of the battery cells 21 and 22 is abnormal in the battery management device 10 and the abnormality information indicating this diagnosis result is received from the battery management device 10, the vehicle controller 30 outputs the torque instruction to set an output torque of the traveling motor 61 to be zero to the traveling inverter 60. Accordingly, the vehicle controller 30 limits the power supply from the assembled battery 20 to the traveling inverter 60 to be completely shut off, and controls the traveling inverter 60 such that the driving of the traveling motor 61 is stopped. That is, since there is the abnormality in the assembled battery 20 in this case so that there is a possibility of reaching a dangerous state if the vehicle continues to travel without any change, the traveling inverter 60 is controlled so as to immediately stop the traveling motor 61.

On the other hand, when it is diagnosed that at least one of the resistors R11, R12, and R13 is in the open state in the battery management device 10 and the abnormality information indicating this diagnosis result is received from the battery management device 10, the vehicle controller 30 outputs a torque instruction to set the output torque of the traveling motor 61 to be a predetermined limit value or less to the traveling inverter 60. Accordingly, the vehicle controller 30 controls the traveling inverter 60 so as to drive the traveling motor 61 such that the traveling of the vehicle is continued to some extent even while limiting the power supply from the assembled battery 20 to the traveling inverter 60. That is, since there is no abnormality in the assembled battery 20 in this case, the limitation on power supply from the assembled battery 20 is mitigated as compared to the case where there is the abnormality in the assembled battery 20 as described above. Accordingly, the traveling inverter 60 is controlled such that the user can move the self-propelled vehicle to a repair shop or the like while squeezing the output of the traveling motor 61 to such an extent that the vehicle does not reach the dangerous state.

The control system according to the second embodiment of the present invention described above includes the battery management device 10, the traveling inverter 60 that performs the driving control of the traveling motor 61, configured to cause the vehicle to travel using the power supplied from the assembled battery 20, and the vehicle controller 30 that controls the traveling inverter 60. In this control system, when diagnosing that at least one of the battery cells 21 and 22 is abnormal or when diagnosing that at least one of the resistors R11, R12 and R13 is in the open state, the battery management device 10 outputs the abnormality information on the abnormality to the vehicle controller 30. The vehicle controller 30 performs the control to limit the power supply from the assembled battery 20 with respect to the traveling inverter 60 based on the abnormality information thus output from the battery management device 10. In this control, when at least one of the resistors R11, R12, and R13 is in the open state, the vehicle controller 30 mitigates the limitation on the power supply from the assembled battery 20 as compared to the case where at least one of the battery cells 21 and 22 is abnormal. In this manner, it is possible to provide the control system that is safe and easy to use by employing the battery management device 10.

—Third Embodiment—

Next, a third embodiment of the present invention will be described. In this embodiment, an example in which control is performed in consideration of noise immunity in the same control system as that described in the third embodiment will be described.

Figure 5:
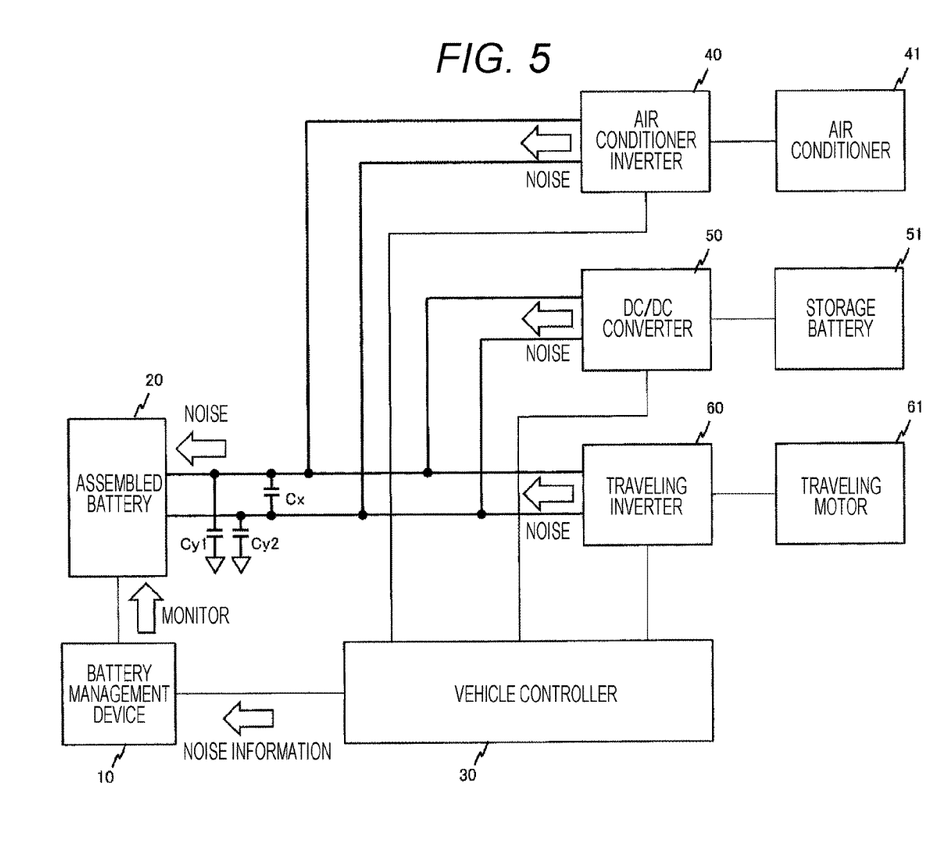
FIG. 5 is a diagram illustrating a configuration of a control system according to a third embodiment of the present invention.

FIG. 5 is a diagram illustrating a configuration of a control system according to the third embodiment of the present invention. The control system illustrated in FIG. 5 is mounted in a vehicle, and includes the battery management device 10, the assembled battery 20, the vehicle controller 30, the air conditioner inverter 40, the DC/DC converter 50 and the traveling inverter 60, which is similar to the control system according to the second embodiment illustrated in FIG. 4.

In FIG. 5, each of the air conditioner inverter 40, the DC/DC converter 50, and the traveling inverter 60 outputs noise corresponding to each operation state thereof to the assembled battery 20. Thus, when the noise input to the assembled battery 20 from these respective devices is excessively great, a correct measurement value may not be obtained in some cases even if the battery management device 10 measures terminal voltages of the battery cells 21 and 22. In such a case, there is a possibility that an erroneous diagnosis result may be derived when the above-described abnormality diagnosis is performed based on the measurement value of the terminal voltage. Thus, the abnormality diagnosis or the detection of terminal voltages of the battery cells 21 and 22 performed by the battery management device 10 is invalidated in a situation where excessive noise is likely to be input to the assembled battery 20 based on noise information output from the vehicle controller 30, in the control system of the present embodiment. This point will be described in detail hereinafter.

In the present embodiment, the vehicle controller 30 estimates each output noise in accordance with each operation state of the air conditioner inverter 40, the DC/DC converter 50, and the traveling inverter 60. For example, in the case of the traveling inverter 60, it is possible to estimate that the output noise from the traveling inverter 60 to the assembled battery 20 increases when an accelerator operation amount of the vehicle changes, when temperature is low, when a carrier frequency in control of the inverter is changed, when a torque fluctuation is great during low-speed traveling, and the like. In addition, for example, in the case of the DC/DC converter 50, it is possible to estimate that the output noise from the DC/DC converter 50 to the assembled battery 20 increases when the temperature is low, when a charge or discharge current of the storage battery 51 is around 0 A, and the like. It is also possible to estimate each magnitude of output noise to the assembled battery 20 from the respective devices of the air conditioner inverter 40, the DC/DC converter 50, and the traveling inverter 60 using various determination conditions other than the above-described conditions. When the output noise has been estimated in this manner, the vehicle controller 30 outputs the noise information on such an estimation result to the battery management device 10.

The battery management device 10 monitors and manages the assembled battery 20 as described in the first embodiment. At this time, the battery management device 10 invalidates the diagnosis of the resistors R11, R12 and R13 performed by the microcomputer 130 or the detection of terminal voltages of the battery cells 21 and 22 performed by the voltage detection unit 120 based on the noise information output from the vehicle controller 30. Specifically, the battery management device 10 causes the diagnosis of the resistors R11, R12, and R13 or the detection of the terminal voltages of the battery cells 21 and 22 not to be performed when a magnitude of noise indicated by the noise information is a predetermined value or more, or when noise from a plurality of devices is superimposed on each other. Incidentally, only one of these operations may be invalidated or both the operations may be invalidated.

The control system according to the third embodiment of the present invention described above includes the battery management device 10, and the vehicle controller 30 that performs control of the respective devices of the air conditioner inverter 40, the DC/DC converter 50, and the traveling inverter 60 that use the power supplied from the assembled battery 20. In this control system, the vehicle controller 30 outputs the noise information on the noise output from each device to the assembled battery 20 to the battery management device 10. The battery management device 10 invalidates the diagnosis of the resistors R11, R12 and R13 performed by the microcomputer 130 and/or the detection of the terminal voltages of the battery cells 21 and 22 performed by the voltage detection unit 120 based on this noise information. In this manner, it is possible to provide the control system excellent in noise immunity by employing the battery management device 10.

Incidentally, the process of invalidating the diagnosis of the resistors R11, R12 and R13 and/or detection results of the terminal voltages of the battery cells 21 and 22 performed by the voltage detection unit 120 may be on the vehicle controller 30 side in the third embodiment of the present invention described above. That is, the vehicle controller 30 estimates the noise output to the assembled battery 20 from each of the air conditioner inverter 40, the DC/DC converter 50, and the traveling inverter 60, and can invalidate diagnosis results of the output resistors R11, R12 and R13 and/or the detection results of the terminal voltages of the battery cells 21 and 22 output from the battery management device 10 based on such an estimation result. Even in this case, the above-described operational effects can be achieved. In this case, the vehicle controller 30 does not necessarily output the noise information to the battery management device 10.

In addition, the respective control systems described in the second and third embodiments maybe applied to control systems other than the control system mounted in the vehicle.

The above-described embodiments and modified examples are merely examples, and the present invention is not limited to these contents unless the features of the invention are impaired.

REFERENCE SIGNS LIST 10 battery management device
20 assembled battery
21, 22 battery cell
30 vehicle controller
40 air conditioner inverter
50 DC/DC converter
60 traveling inverter
100 battery monitoring circuit
101 multiplexer
102 amplifier
103 AD converter
104 state machine
110 RC filter
120 voltage detection unit
130 microcomputer

The invention claimed is:

1. A battery management device comprising:
a voltage detection unit that is electrically connected to both poles of each of a plurality of battery cells via a voltage detection line and detects each terminal voltage of the plurality of battery cells;
a filter circuit that is configured using a resistor and a capacitor and electrically connected to the voltage detection line;
a current source that repeatedly performs an energization operation to cause a current to flow to the voltage detection line in order to change a stored charge amount of the capacitor; and
a diagnosis unit that diagnoses whether the resistor is in a normal state or an open state based on a result of detection of the terminal voltage performed by the voltage detection unit,
wherein the current source performs the energization operation with a magnitude of a current that enables the stored charge amount changed by the energization operation performed once to fall within a range corresponding to a fluctuation width of the terminal voltage during the energization operation when the resistor is in the normal state,
the diagnosis unit diagnoses that the resistor is in the open state when a difference between the terminal voltage detected at a current time and the terminal voltage detected at a past time is larger than a predetermined threshold value, and
wherein the diagnosis unit diagnoses that the resistor is in the open state when the difference between the terminal voltage detected at the current time and the terminal voltage detected a predetermined diagnosis time before the current time is larger than the threshold value, and the diagnosis time is set based on a time required until a voltage change of the voltage detection line, caused depending on a sum of the stored charge amount changed by a plurality times of the energization operations performed within the time, exceeds the threshold value when the resistor is in the open state.

2. The battery management device according to claim 1, wherein the filter circuit is configured using a plurality of the resistors and the capacitors electrically connected to each of a plurality of the voltage detection lines, and the current source performs the energization operation such that each stored charge amount of the plurality of capacitors changes in the same direction.

3. The battery management device according to claim 1, further comprising a selection circuit that sequentially selects the plurality of voltage detection lines to be connected to the voltage detection unit, wherein the current source is connected to the voltage detection line via the selection circuit, and the current intermittently flows from the current source to each of the plurality of voltage detection lines in accordance with a selection operation of the selection circuit.

4. The battery management device according to claim 3, wherein the selection circuit sequentially selects the plurality of voltage detection lines such that each of the plurality of voltage detection lines is connected to the voltage detection unit for the same number of times.

5. A control system comprising:

the battery management device according to claim 1;

a traveling inverter that performs drive control of a traveling motor configured to cause a vehicle equipped with the battery management device to travel using power supplied from an assembled battery configured of the plurality of battery cells; and a vehicle control device that controls the traveling inverter, wherein the battery management device outputs abnormality information on an abnormality to the vehicle control device when it is diagnosed that at least one of the plurality of battery cells is abnormal or diagnosed that the resistor is in an open state, the vehicle control device performs control to limit power supply from the assembled battery with respect to the traveling inverter based on the abnormality information, and the vehicle control device mitigates the limit on the power supply from the assembled battery when the resistor is the open state as compared to a case where at least any one of the plurality of battery cells is abnormal during the control.

6. A control system comprising:

the battery management device according to claim 1; and a control device that performs control of a device using power to be supplied from an assembled battery configured of the plurality of battery cells, wherein the control device outputs noise information on noise, output from the device to the assembled battery, to the battery management device, and the battery management device invalidates diagnosis of the resistor performed by the diagnosis unit and/or detection of the terminal voltage performed by the voltage detection unit based on the noise information.

7. A control system comprising:

the battery management device according to claim 1; and a control device that performs control of a device using power to be supplied from an assembled battery configured of the plurality of battery cells, wherein the control device estimates noise to be output from the device to the assembled battery and invalidates a diagnosis result of the resistor and/or a detection result of the terminal voltage output from the battery management device based on an estimation result.

* * * * *